Feb. 16, 1971 A. P. BROKAW 3,564,445

CIRCUIT FOR ELIMINATING CROSSOVER DISTORTION IN SOLID STATE AMPLIFIERS

Filed Oct. 9, 1968 2 Sheets-Sheet 1

INVENTOR.
A. PAUL BROKAW

INVENTOR
A. PAUL BROKAW 3,564,445

CIRCUIT FOR ELIMINATING CROSSOVER DISTORTION IN SOLID STATE AMPLIFIERS

Adrian Paul Brokaw, Woburn, Mass., assignor to the United States of America as represented by the Secretary of the Navy

Filed Oct. 9, 1968, Ser. No. 766,095
Int. Cl. H03f *1/26, 1/34*
U.S. Cl. 330—110 4 Claims

ABSTRACT OF THE DISCLOSURE

A predistortion circuit is disclosed for solid state push-pull amplifiers which eliminates crossover distortion present when these amplifiers are improperly biased. This distortion is eliminated by amplifying the input signal by an amount sufficient to bias the transistors of the push-pull amplifier into conduction. The predistortion circuit, which amplifies the input signal, consists of a driver having a pair of parallel back-to-back diodes in its noninverting feedback loop. The current-voltage characteristics of these diodes control the transfer characteristic of the driver and give it a transfer characteristic which complements that of the push-pull amplifier.

The invention described herein may be manufactured and used by or for the Government of the United States of America for governmental purposes without the payment of any royalties thereon or therefor.

This invention relates to a biasing arrangement for solid state push-pull amplifiers and, more particularly, to a predistortion circuit which superimposes on an input signal a signal component which provides the correct forward bias for the solid state devices in the amplifier.

In solid state push-pull amplifiers, one of the major problems is maintaining the correct bias voltage on the transistors. Since the transistors exhibit nonlinear characteristics, their bias requirements therefore change with changes in input voltage. An additional complication is the variation in bias requirement as a function of temperature. While it is possible to continuously overbias the transistors to assure conduction throdughout the entire duty cycle of the push-pull amplifier, this mode of operation requires that a considerable and continuous amount of power be applied to the transistors. There are, however, numerous applications such as battery-powered voice amplifiers and self-contained sonar systems where only intermittent use is made of the power amplifier. In these applications, the appropriate bias need only be applied intermittently to the power amplifier.

In the present invention the proper amount of bias is supplied to the push-pull amplifier only when a signal appears at its input circuit. This is accomplished by predistorting this input signal in such a manner that a portion of it supplies the appropriate bias necessary to place the transistors into their operating mode. The use of this predistortion technique substantially reduces the crossover distortion problem inherent in solid state push-pull amplifiers while at the same time reducing the standby power requirements of the system.

The amount of the predistortion signal necessary is exactly the voltage which will bias the transistors into conduction. After initial conduction occurs, additional bias must be added. It will be appreciated that this additional bias is not constant but changes with the characteristics of the transistors used. These characteristics are a result of the semiconductor material and nonlinear responses to temperature variations. Since the transistors in the push-pull amplifier do not exhibit linear characteristics, the predistortion circuit adds to the initial wave form an amount of signal equal to the initial conduction voltage plus a nonlinear voltage plus a nonlinear voltage corresponding to the nonlinear characteristics mentioned above. Since this signal is dissipated when the transistors are biased into conduction, the output of the push-pull amplifier will be identical to the wave form appearing at the input to the predistortion circuit. By adding these voltages only when the wave form appears at the input to the predistortion circuit, the effective discharge lifetime of the battery power supply is increased.

Predistortion of the input signal is accomplished, according to the present invention, by placing a pair of diodes in the noninverting feedback path of a driver amplifier. The current-voltage characteristics of these diodes match the current-voltage characteristics of the semiconducting devices in the push-pull amplifier. When these diodes are inserted into the feedback path of the driver, they give the driver a corresponding transfer characteristic. The driver amplifies the input signal until the diodes conduct. Since the voltage necessary to bias the diodes is the same as or directly proportional to the voltage necessary to initially forward bias the above semiconducting devices, that portion of the linearly amplified output of the driver controlled by the diodes' cutoff provides the initial bias to the push-pull amplifier while the sinusoidal portion drives the power amplifier. After the initial bias is supplied, the driver continues to supply additional forward bias to compensate for the nonlinearity of the elements in the push-pull amplifier. This additional bias is controlled by the nonlinear portion of the current-voltage characteristic of each diode. Since the nonlinear as well as the linear characteristics of the diodes match those of the semiconducting devices in the push-pull amplifier, the proper forward bias is maintained over the entire operating range of the driver-amplifier combination.

It is therefore an object of the present invention to provide a predistortion circuit for a solid state push-pull amplifier which amplifies the input signal to that extent necessary to bias each of the transistors in the push-pull amplifier into conduction without distorting the wave form of the original signal.

Other objects, advantages and novel features of the invention will become apparent from the following detailed description thereof when considered in conjunction with the accompanying drawings in which like numerals represent like parts throughout and wherein.

Figure 1:
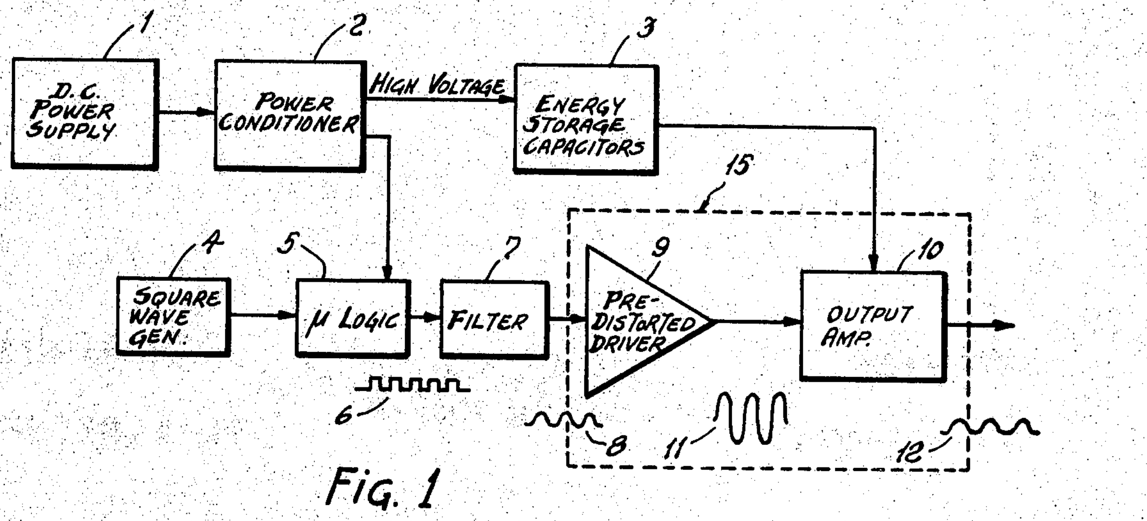
FIG. 1 is a block diagram showing a battery-powered sonar system in which the output amplifier is driven by a predistortion signal.

Referring to FIG. 1, predistorted driver 9 is used to drive a power amplifier 10 in a battery-operated sonar system. It will be appreciated that only intermittent use is made of this amplifier by the sonar system when it operates in a pulsed mode. The present invention alleviates the need for biasing the power amplifier when it is in the standby mode, thus reducing the power requirements of the system while at the same time reducing crossover distortion.

This sonar system is characterized by a DC power supply 1, a power conditioner 2 and a high voltage energy storage 3 which supplies the power amplifier. The pulsed input signal to this amplifier is generated by square-wave generator 4, micrologic 5 which regulates the sonar pulse bursts and a filter 7 which changes the bursts of pulses into a sinusoidal burst. These sinusoidal bursts feed the input of the driver. The wave forms generated by this sonar system shown at 6, 8, 11 and 12.

Predistorted predistortion driver 9 increases the amplitude of the incoming train by that amount which is necessary to bias the transistors of output amplifier 10 into conduction. The output amplifier subsequently absorbs that portion of the driver signal which places the transistors into conduction. Having removed this signal, the output of the amplifier is an amplified duplicate of the undistorted input to the driver. It will be appreciated that, in order to produce the exact voltage necessary to forward bias the transistors of the power amplifier, use is made of the current-voltage characteristics of the transistors themselves.

Figure 2:
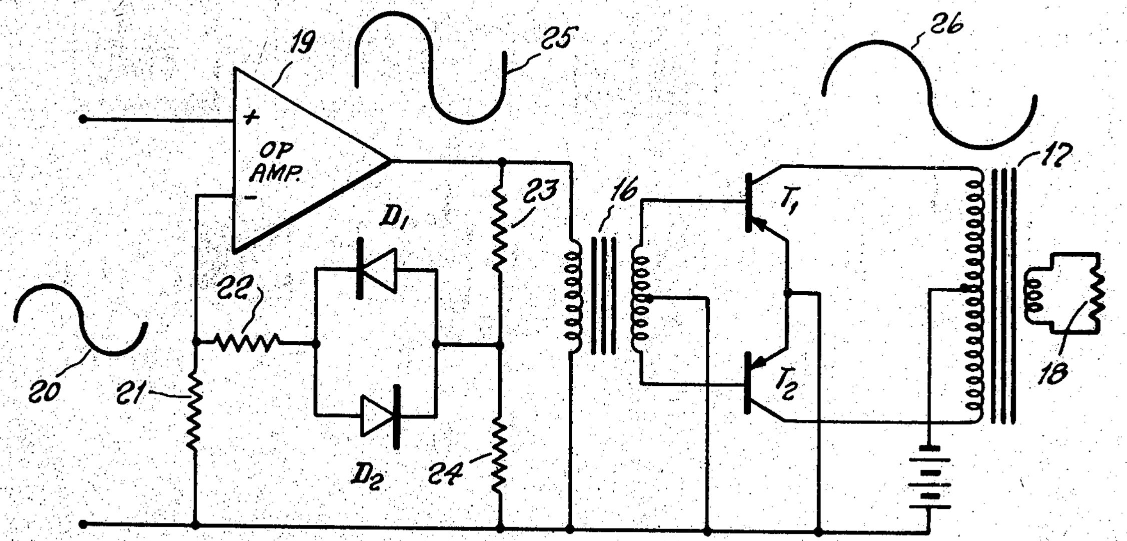
FIG. 2 is a schematic diagram of the predistortion circuit with a push-pull solid state power amplifier.

FIG. 2 shows that portion of the circuit of FIG. 1 enclosed by dotted lines 15. In this schematic diagram, a push-pull transistor amplifier consisting of pnp transistors $T_1$ and $T_2$ is shown connected to the secondary of an input transformer 16. The collectors of transistors $T_1$ and $T_2$ are connected to the primary of output transformer 17, whose secondary is connected to a suitable load 18. It will be appreciated that when npn transistors are utilized in the push-pull amplifier, the resulting output is identical to the above pnp push-pull amplifier.

With no bias present, when this push-pull amplifier is fed by a sinusoidal signal, only certain portions of this signal will appear in the output circuit. This loss occurs because a portion of the input signal is used to bias each of the transistors into conduction. Only a portion of the input signal is therefore amplified during the duty cycle. In this mode, the amplifier may be considered a class C amplifier.

If, however, the input signal is increased in amplitude an amount equal to the cut-off voltage of the transistors, no portion of the original input signal will be lost. An efficient method of predistorting this input signal is shown by the feedback amplifier or driver 19. This feedback amplifier has a pair of diodes $D_1$ and $D_2$ in its noninverting feedback loop which are chosen so that they have essentially the same current-voltage characteristics as the base-emitter junctions of transistors $T_1$ and $T_2$.

In operation, an incoming signal, shown diagrammatically at 20, appears at the input circuit of the feedback amplifier. This signal receives amplification until diodes $D_1$ and $D_2$ are rendered conducting. At this point, the feedback signal is fed back through to the inverting input of the amplifier. This signal, when subtracted from the input signal in the feedback amplifier, will be approximately equal to the initial input signal thus limiting the output of the feedback amplifier when a predetermined amplification is reached. The output signal thus produced is then introduced into the primary of transformer 16.

The amplification factor of the feedback amplifier is determined by the characteristics of the diodes, the biasing resistor 21, internal resistance 22 and the voltage dividing circuit composed of resistors 23 and 24, if this latter circuit is used. For input signals greater than zero volts, the output of amplifier 19 must go sufficiently positive to turn on diode $D_1$ and bring the inverting input of the amplifier up to the input signal level. Assuming negligible internal resistance and the diodes connected directly to the output of amplifier 19, the resulting output voltage of the amplifier consists of the input voltage plus the diode voltage drop. Similarly, for negative swings of the input to amplifier 19, the output voltage must be sufficient to turn on diode $D_2$. When $D_2$ is turned on, the output voltage of the amplifier is equal to the input voltage minus the diode voltage drop. In addition, the amplifier must have a sufficiently high frequency response to make the transitions about zero output in a time which is negligible compared to the frequencies being amplified. Since the voltage drop of a diode is made to be approximately the same as that of the minimum effective transistor bias voltage, a 1:2 center tap transformer will provide the push-pull amplifier with a signal which is properly predistorted.

If it is desired to operate at a higher voltage level on the primary side of transformer 16, additional diode pairs may be placed in series with the feedback path. Alternately, using only one pair of diodes, a voltage dividing network, shown at 23 and 24, may be used. The ratio of $R_{23}:R_{24}$ should be twice the driver transformer primary to secondary ratio minus one. The result of the predistortion is shown at 25. The undistorted output of the push-pull amplifier is shown at 26.

Figure 3:
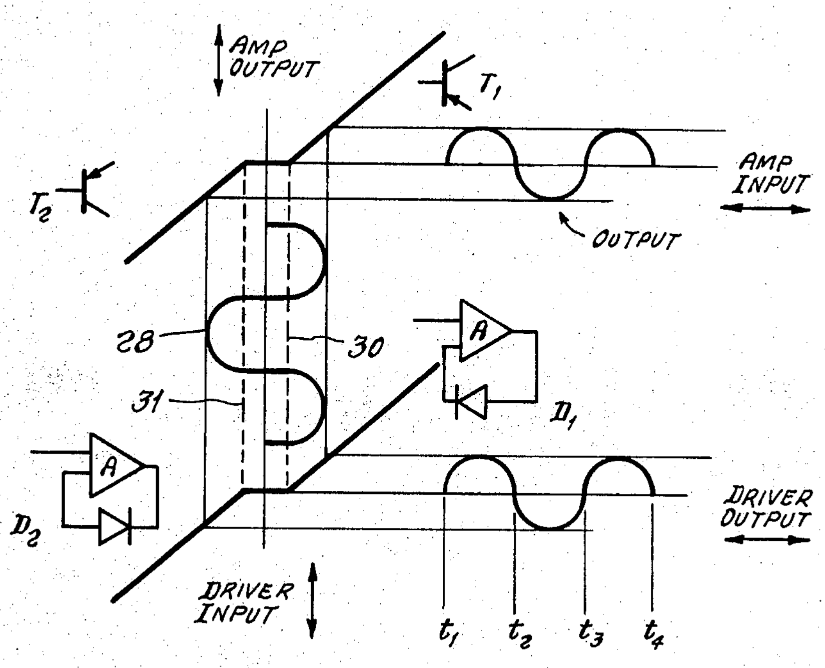
FIG. 3 is a composite chart showing the transfer characteristics of the driver and the power amplifier.

FIG. 3 is a graph of the transfer characteristics of the driver and the push-pull amplifier. These transfer characteristics directly reflect the input-output voltage characteristics of their diodes and transisors, respectively. An input signal 27 is shown centered around the zero input line. This line is also the output coordinate axis of the driver. When the first part of this signal, marked $t_1$ is passed through the driver, it is amplified by an amount equal to the conduction potential of $D_1$. This potential is shown by line 30. Thereafter, the input signal is amplified both by this potential and by the increased potential represented by the slanted portion of the driver characteristic. The negative excursion of the input signal, starting at $t_1$, is amplified in the same manner with the conduction potential of $D_2$ represented by line 31. The conduction potentials of $D_1$ and $D_2$ are exactly the same as the conduction potentials of $T_1$ and $T_2$. The next positive excursion starting at $t_3$ is amplified in a like manner. The output signal of the driver, which is also the input signal to the amplifier, is shown by the predistorted wave form 28. This predistorted signal is then fed to the push-pull amplifier. For convenience, this signal is the same signal shown at 28. It is centered around the zero input line of the amplifier which is also the output coordinate axis of the amplifier.

The push-pull amplifier first absorbs the linear portion of the distorted driver signal, removing that portion of the driver signal lying between lines 30 and 31. Secondly, the transistors in this amplifier absorb that amount of potential added by the nonlinearity of slanted lines of the driver characteristic. Because of the matching and inverted transfer characteristics, all of the predistorted portion of the input signal is used to bias the transistors of the power amplifier. This assures that the push-pull amplifier always has sufficient bias potential. The output of the push-pull amplifier will therefore contain very little crossover distortion. After the above two biasing potentials have been dissipated, what remains is an undistorted amplified version of the original input.

If both the transistors and the diodes are of the same material, such as silicon, the transfer characteristics of the above-mentioned driver and push-pull amplifier will complement each other over a wide temperature range. This results in an undistorted output even if the current-voltage characteristics of the transistors and the diodes are completely nonlinear. The only requirement is that the amplifiers in which they are incorporated have substantially complementary transfer characteristics. This will occur if both the transistors and the diodes have appropriate current-voltage charatcerisitcs.

Figure 4:
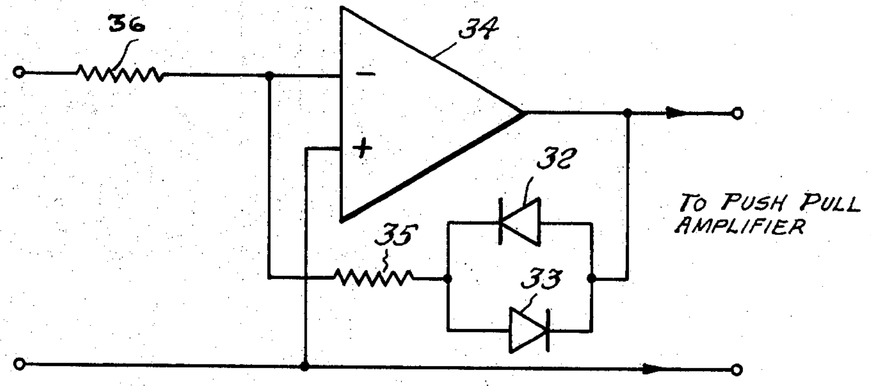
FIG. 4 shows an alternate method of driving the power amplifier shown in FIG. 2.

FIG. 4 shows an alternate embodiment of the driver. In this case, the diode pair 32 and 33 is placed in the feedback loop of an inverting driver amplifier 34. This amplifier operates on the same principle as the feedback amplifier shown in FIG. 2. The voltage drop across resistor 35 and diodes 32 and 33 control the level of the output of the amplifier in the same manner as the feedback amplifier shown in FIG. 2. Resistor 36 coresponds to biasing resistor 21 of FIG. 2. Introducing predistortion by means of diodes in an inverting amplifier feedback loop has the posible advantage that it does not require an amplifier with an input common mode capability.

It will be appreciated that this predistortion circuit is not limited to push-pull solid state amplifiers since it may be used in conjunction with any solid state amplifying device.

Obviously many modifications and variations of the present invention are possible in the light of the above teachings. It is therefore to be understood that within the scope of the appended claims the invention may be practiced otherwise than as specificaly described.

What is claimed is:

1. A circuit for adding a constant voltage component to the input signal applied to a solid state push-pull amplifier so as to eliminate crossover distortion caused when the active solid state elements thereof are not provided with bias voltage, comprising:

an operational amplifier, said operational amplifier having a first input circuit to which said input signal is applied, an output circuit, and a noninverting input circuit adapted to receive a negative feedback signal derived from said output circuit;

means for coupling the output circuit of said operational amplifier to the input circuit of said push-pull amplifier; and a pair of diodes connected in parallel with opposite poles interconnected, one side of said pair being connected to said output circuit and the other side being connected to said noninverting input circuit such that said feedback signal has is positive and negative portions coupled through different diodes to said noninverting input circuit, said feedback signal providing said operational amplifier with a transfer characteristic complementary to that of said push-pull amplifier such that whenever said input signal is applied to said first input circuit, the signal coupled from said output circuit to said push-pull amplifier contains a constant voltage component equal to that bias voltage necessary to render said active elements conducting, whereby crossover distortion is eliminated by a bias voltage which is applied only when there is an input signal applied to said first input circuit.

2. The circuit as recited in claim 1 wherein said active elements and said diodes have matching voltage-current characteristics, whereby said apparatus additionally compensates for any nonlinear distortions introduced by the transfer characteristics of said active elements by predistorting the signal coupled to said push-pull amplifier.

3. The circuit as recited in claim 2 wherein said matching voltage-current characteristics are obtained by forming said active elements and said diodes from the same materials.

4. A circuit for adding a constant voltage component to the input signal applied to a solid state push-pull amplifier so as to eliminate crossover distortion caused when the active solid state elements thereof are not provided with bias voltage, comprising:

an operational amplifier, said operational amplifier having a first input circuit to which said input signal is applied and a noninverting input circuit adapted to receive a negative feedback signal derived from the output of said operational amplifier;

first and second resistive elements connected in series between the output of said operational amplifier and a reference potential with one side of said second resistive element being connected to said reference potential;

a pair of diodes connected in parallel with opposite poles interconnected, one side of said pair being connected to said noninverting input circuit and the other side being connected to the junction of said first and second resistive elements, whereby a negative feedback path is formed by said first resistive element and said diode pair; and a transformer having its primary connected between the output of said operational amplifier and said reference potential and its secondary being coupled to the input of said push-pull amplifier, the primary-to-secondary ratio of said transformer minus one being equal to one-half the ratio of the resistance of said first resistive element to that of said second resistive element such that the transfer characteristic of the operational amplifier-transformer combination is complementary to that of said push-pull amplifier, whereby whenever said input signal is applied to said first input circuit, said push-pull amplifier is provided with a signal having a constant voltage component equal to that bias voltage which is necessary to render said active elements conducting.

References Cited

UNITED STATES PATENTS

| | | | |
|---|---|---|---|
| 2,999,986 | 9/1961 | Holbrook | 330—149 |
| 3,034,068 | 5/1962 | Hansen | 330—110X |
| 3,042,877 | 7/1962 | Barnes | 330—149 |
| 3,469,202 | 9/1969 | Priddy | 330—28 |

NATHAN KAUFMAN, Primary Examiner

U.S. Cl. X.R.

330—24, 31, 99, 149